US006414502B1

(12) United States Patent
Sayre et al.

(10) Patent No.: US 6,414,502 B1
(45) Date of Patent: Jul. 2, 2002

(54) LOADED-BOARD, GUIDED-PROBE TEST FIXTURE

(75) Inventors: Tracy L. Sayre, Fort Collins; Robert A. Slutz; Kris J. Kanack, both of Loveland, all of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/586,947

(22) Filed: Jun. 2, 2000

Related U.S. Application Data

(62) Division of application No. 09/348,523, filed on Jul. 7, 1999, now Pat. No. 6,225,817, which is a division of application No. 08/739,387, filed on Oct. 29, 1996, now Pat. No. 5,945,836.

(51) Int. Cl.[7] .............................................. G01R 31/02
(52) U.S. Cl. ........................ 324/755; 324/758; 324/761
(58) Field of Search ................................ 324/754, 755, 324/757, 758, 761, 762, 765

(56) References Cited

U.S. PATENT DOCUMENTS

| | | | |
|---|---|---|---|
| 4,230,985 A | 10/1980 | Matrone et al. ............. 324/755 |
| 4,321,533 A | 3/1982 | Matrone ....................... 324/757 |
| 4,535,536 A | 8/1985 | Wyss ............................ 29/845 |
| 4,724,383 A | 2/1988 | Hart ............................. 324/158 |
| 4,771,234 A | 9/1988 | Cook et al. ................... 324/158 |
| 4,774,459 A | 9/1988 | Maelzer et al. .............. 324/754 |
| 4,774,462 A | 9/1988 | Black .......................... 324/758 |
| 4,799,007 A | 1/1989 | Cook et al. ................... 324/158 |
| 4,818,933 A | 4/1989 | Kerschner et al. ........... 324/158 |
| 4,884,024 A | 11/1989 | DiPerna ....................... 324/761 |
| 4,935,696 A | 6/1990 | DiPerna ....................... 324/158 |
| 4,977,370 A | 12/1990 | Andrews ..................... 324/761 |
| 5,399,982 A | * 3/1995 | Driller et al. ................ 324/754 |
| 5,450,017 A | 9/1995 | Swart ........................... 324/754 |
| 5,485,096 A | 1/1996 | Aksu ........................... 324/761 |
| 5,493,230 A | 2/1996 | Swart et al. ................. 324/754 |
| 5,506,510 A | 4/1996 | Blumenau .................... 324/754 |
| 5,510,722 A | 4/1996 | Seavey ........................ 324/758 |
| 5,663,655 A | 9/1997 | Johnston et al. ............ 324/761 |
| 5,764,069 A | * 6/1998 | Cugini ......................... 324/761 |
| 5,773,988 A | 6/1998 | Sayre et al. ................. 324/761 |
| 5,818,248 A | 10/1998 | St. Onge ..................... 324/761 |
| 6,047,469 A | * 4/2000 | Luna ........................... 29/830 |

FOREIGN PATENT DOCUMENTS

| | | | | |
|---|---|---|---|---|
| DE | 19507127 A | 9/1996 | ........... G01R/1/073 |
| EP | 0135384 A | 3/1985 | ........... G01R/1/073 |

* cited by examiner

*Primary Examiner*—Michael J. Sherry
*Assistant Examiner*—Russell M. Kobert

(57) ABSTRACT

A test fixture for electrically connecting a plurality of limited-access test targets on a loaded circuit board with a plurality of interface probes of a tester may comprise a plurality of elongate test probes, a universal interface plate (UIP), and a wireless interface printed circuit board (WIPCB). A first end of each elongate test probe is substantially aligned with a limited-access target on the loaded circuit board when the test fixture is positioned adjacent the loaded circuit board. Each of a plurality of double-headed spring probes mounted to the UIP has a first spring loaded head located at its first end and a second spring loaded head located at its second end. Each double-headed spring probe is generally axially aligned with an elongate test probe so that its first spring loaded head contacts a second end of the corresponding elongate test probe. Each of a plurality of contact pads on the first side of the WIPCB is substantially aligned with a double-headed spring probe so that each contact pad contacts the second spring loaded head of the corresponding double-headed spring probe. Each of a plurality of contact targets on the second side of the WIPCB is electrically connected to a contact pad on the first side of the WIPCB and contacts an interface probe of the tester when the test fixture is mounted on the tester.

7 Claims, 8 Drawing Sheets

LOADED-BOARD, GUIDED-PROBE TEST FIXTURE

CROSS REFERENCE TO RELATED APPLICATIONS

This application is a division of U.S. application Ser. No. 09/348,523, filed Jul. 7, 1999, now U.S. Pat. No. 6,225,817, which is a divisional of U.S. application Ser. No. 08/739,387, filed Oct. 29, 1996, now U.S. Pat. No. 5,945,836, both of which are incorporated herein by reference for all that they disclose.

FIELD OF THE INVENTION

The present invention relates generally to the field of test equipment for testing printed circuit boards, and more particularly to board test fixtures and other mechanical interfaces for electrically interconnecting electronic circuit cards having electronic components and the like to the interface probes of a loaded-board tester.

BACKGROUND OF THE INVENTION
Loaded-Board Test Fixtures

After printed circuit boards (PCB's) have been manufactured and loaded with components, and before they can be used or placed into assembled products, they should be tested to verify that all required electrical connections have been properly completed and that all necessary electrical components have been attached or mounted to the board in proper position and with proper orientation. Other reasons for testing printed circuit boards are to determine and verify whether the proper components have been used and whether they are of the proper value. It is also necessary to determine whether each component performs properly (i.e., in accordance with the specification). Some electrical components and electro-mechanical components also may require adjustment after installation.

Loaded-board testing has complex multiplexed tester resources and is capable of probing soldered leads, vias and testpads on loaded boards with topside and bottom side components. Loaded-board testing includes analog and digital tests, such as tests for electrical connectivity, voltage, resistance, capacitance, inductance, circuit function, device function, polarity, vector testing, vectorless testing, and circuit functional testing. Loaded-board testing requires very low contact resistance between the test targets and the fixture components.

Advances in circuit board and electronic component packaging technology have escalated the probe spacing demands placed on loaded-board test equipment. Existing state-of-the-art technology requires loaded-board test equipment capable of accessing test targets which are spaced apart by 50 mils (center to center) or less, where test targets are physical features on a PCB or electronic component which may be probed during testing. One of the greatest challenges faced by loaded-board test equipment manufacturers now and in the future is a high false failure and test malfunction rate caused by physical and electrical contact problems. These problems are exacerbated by existing fixture limitations in probing accuracy, probing pitch (center to center spacing), and surface contamination.

As component and board geometries shrink and become denser, loaded-board testing becomes more difficult using standard fixtures. Existing shortwire, loaded-board fixtures can consistently hit test targets equal to or greater than 35 mils in diameter with equal to or greater than 75-mil pitch. Targets which are smaller or more closely spaced cannot be probed with consistency due to prohibitive component and system tolerance stack-ups.

A variety of test fixtures have heretofore been available for testing loaded boards on test equipment. A device under test (DUT) typically embodies a PCB loaded with electronic components and electronic hardware. FIG. 1 shows a conventional shortwire, loaded-board fixture, which consists of a DUT 108 with outer-layer artwork, a standard 106 or variable 118 tooling pin for alignment, a probe protection plate 104, standard spring probes 120 whose tips 116 exactly correspond to test target locations 110 and 112, spacers 114 to limit the deflection of the DUT under vacuum loading, a probe-mounting plate 102 in which the spring probes 120 are installed, personality pins 100 which are wired to the spring probes 120, and an alignment plate 122 which aligns the wirewrap tails of the personality pins 100 into a regularly spaced pattern so that they can line up with interface probes 124 mounted in the tester (not shown) Note: a spring probe is a standard device, commonly used by the test community, which conducts electrical signals and contains a compression spring and plunger that move relative to the barrel and/or socket when actuated. A solid probe also conducts electrical signals but has no additional parts which move relative to each other during actuation.

During test, the DUT 108 is pulled down by vacuum or other known mechanical means to contact the tips 116 of the spring probes 120. The sockets of the standard spring probes 120 are wired to personality pins 100, and an alignment plate 122 funnels the long, flexible personality pin tips 126 into a regularly spaced pattern. The tips 126 of personality pins 100 contact the interface probes 124 located in the tester (not shown). Once electrical contact between the DUT 108 and the tester is established, in-circuit or functional testing may commence. Hewlett-Packard Company Application Note 340-1 titled "Reducing Fixture-Induced Test Failures," (printed December 1990 and can be obtained from Hewlett-Packard Company in Palo Alto, Calif.), discloses shortwire fixturing and is incorporated herein for all that it teaches. U.S. Pat. No. 4,771,234 titled "Vacuum-Actuated Test Fixture" by Cook et al. discloses a longwire fixture and is incorporated herein for all that it teaches.

FIG. 2 shows one conventional fixture that attempts to address limited-access problems during testing. The term "limited-access" refers to something that cannot easily be reached, or accessed, due to physical restrictions or constraints. For example, a limited-access PCB may contain many targets that are too closely is spaced to accurately probe using existing fixture technology. The term "standard-access" refers to that which can be reached, or accessed, using existing fixture technology. The fixture of FIG. 2 consists of a DUT 206 with testpads 208 and 210, a tooling pin 204, a probe protection plate 202, standard spring probes 214 and 216 installed in a probe-mounting plate 200, and short probes 212 and 220 commonly referred to as "ULTRALIGN" probes (Ultralign is a registered trademark of TTI Testron, Inc.) installed directly in the probe protection plate 202. Upon actuation, standard spring probes 216 and 214 located in the probe-mounting plate 200 push against the floating plungers of "ULTRALIGN" probes 212 and 220. These short plungers are forced upward to contact test targets 208 and 210, while the sockets 218 and 222 remain fixed within the probe protection plate 202. An "ULTRALIGN" fixture may contain a mixture of spring probes for probing standard-access targets and ",ULTRALIGN" probes for probing limited-access targets.

Despite its potential benefits, the "ULTRALIGN" fixture can be expensive and does not probe targets with a pitch of less than 50 mils. An "ULTRALIGN" fixture only permits limited probe travel which may result in poor connectivity between the probes 212 and 220 and the test targets 208 and 210. Also, these probes are costly and require expensive maintenance to replace worn or broken "ULTPALIGN" probes. An example of this type of fixture is disclosed in U.S. Pat. No. 5,510,772 entitled "Test Fixture for Printed Circuit Boards" to Seavey, which is incorporated herein for all that it teaches.

FIG. 3 shows a conventional guided-probe protection plate fixture. Guided-probe protection plates are used in standard loaded-board test fixtures to improve the pointing accuracy of spring probes. These plates contain cone-shaped through-holes which guide, or funnel, the tips of spring probes toward test targets. Such a fixture consists of a probe-mounting plate 300 with standard spring probes 312 and 314, a guided-probe protection plate 302 with spacers 310 and cone-shaped holes 316 for guiding the spring probes to the test targets 306 and 308 on the DUT 304. Additional manufacturing steps and increased fixture maintenance are required due to increased wear on the probes and the probe protection plate, and generally only narrow probe tip styles can be used. Although probing accuracy is slightly enhanced with this method, targets with center-to-center spacing of less than 75 mils cannot be probed reliably.

Bare-Board Test Fixtures

Bare-board testing probes testpads, vias, and plated through holes on bare printed circuit boards only and tests for electrical connectivity and continuity between various test points in the circuits on the printed circuit boards before any components are mounted on the board. A typical bare-board tester contains test electronics with a huge number of switches connecting test probes to corresponding test circuits in the electronic test analyzer.

While loaded-board testing can determine an electronic component's existence, proper orientation, or functionality, bare-board testing only checks for electrical continuity on PCB's without components. Bare-board testing does not require the very low contact resistance that loaded-board testing requires, nor does bare-board testing utilize sophisticated and complex multiplexed tester resources which must be assigned to specific targets and circuits on the device under test.

In previous years, PCB's were designed and manufactured so that their features resided in a regularly spaced pattern. During testing, the PCB was placed directly atop a regularly spaced pattern of interface probes located in the tester. As PCB and component geometries shrunk, PCB features could no longer be placed in a regularly spaced pattern and probed directly by interface probes. A bare-board fixture was developed which utilized long, leaning solid probes to provide electrical connections between small, closely spaced, randomly located targets on the PCB and regularly spaced interface probes located in the tester. Circuit Check, Inc. (Maple Grove, Minn.), Everett Charles Technologies (Pomona, Calif.), and Mania Testerion, Inc. (Santa Ana, Calif.), among others, make bare-board test fixtures which are commonly used on bare-board testers today.

Although each bare-board fixture builder uses unique components and manufacturing processes, most bare-board fixtures resemble FIG. 4 and include regularly spaced spring probes 414 on a tester and long, solid test probes 402 and 416 inserted through several layers of guide plates 400 drilled with small through-holes and held in a spaced-apart fashion with spacers 410. The bed of standard spring probes 414 actuate the solid test probes 402 and 416. The long, solid probes 402 and 416 may be inserted into the guide plates 400 vertically or at an angle in order to facilitate an easy transition between the fine-pitch, or very close, spacing of testpads 404 and 406 on the PCB side of the fixture and the larger-pitch spacing of the spring probes 414 on the tester side of the fixture. One such bare-board fixture is disclosed in U.S. Pat. No. 5,493,230 titled "Retention of Test Probes in Translator Fixtures" to Swart et al., which is incorporated herein for all that it teaches.

Existing bare-board fixtures can consistently hit test targets equal to or greater than 20 mils in diameter with equal to or greater than 20-mil pitch (center-to-center spacing). Unfortunately, it is not possible to use bare-board fixtures directly on a loaded-board tester because there are many unique features which render bare-board test equipment directly incompatible with loaded-board test equipment.

Bare-board fixtures are not designed to accommodate PCBs which are populated with electronic components; only PCB features which are flush with respect to the PCB (pads, vias, and plated through holes) can be probed. Bare-board testers are used to determine the connectivity and continuity of test points and circuitry in a PCB. Unlike bare-board testers, loaded-board testers cannot tolerate higher electrical resistance between a target on a PCB and the tester electronics. Loaded-board fixtures must provide low-resistance connections and interfaces between targets, fixture components, and tester electronics. Unlike loaded-board testers, bare-board testers cannot determine whether a component or a group of components exists and functions properly.

The spacing of bare-board tester interface probes is approximately 0.050 inches by 0.050 inches or 0.100 inches by 0.100 inches, while the spacing of Hewlett-Packard's tester interface probes is approximately 0.150 inches by 0.350 inches. The probe spacing of bare-board fixtures which are designed to fit on bare-board testers is not compatible with the interface probe spacing of Hewlett-Packard's loaded-board tester. Bare-board fixtures translate a target on the PCB under test to the nearest interface probe in the bare-board tester. However, loaded-board tester resources must be uniquely assigned and linked to specific targets and circuits. In loaded-board testing, the nearest interface probe may not be appropriate for a given target. Bare-board fixtures are not able to provide unique electrical routing to adjacent, nonadjacent, and remote tester resources; cannot reach remote resources; and cannot provide the complex, loaded-board resource routing patterns required by a loaded printed circuit board.

The term "no-clean" refers to the non-conductive solder flux residue which remains on printed circuit assemblies after components have been attached. Unless this contamination is removed, no-clean targets, or targets which are coated with this non-conductive surface residue, provide poor electrical contact and are difficult to test. Furthermore, industry trends, such as smaller component packaging and denser PCBs, are forcing electronics' manufacturers to confront smaller center-to-center target spacing, and small-diameter targets. These challenges require an improved loaded-board test fixture that is capable of providing reliable, consistent in-circuit and circuit functional testing of printed circuit assemblies by probing the smaller, more closely spaced targets on today's no-clean, loaded printed circuit boards, while at the same time probing vias and testpads on loaded-boards with top and bottom-side components and testing for electrical connectivity, voltage, resistance, capacitance, inductance, circuit function, device function, polarity, vector testing, vectorless testing, and circuit functional testing.

Loaded-board equipment manufacturers and fixture builders have designed several accessories and products to improve the testability of small, fine-pitch targets, but no design has completely solved the physical and electrical contact problems, while remaining competitively priced and easy to build and maintain. There is a need for such an improved loaded-board, guided-probed test fixture that solves the physical and electrical problems related to limited-access testing, is competitively ipriced, accommodates the sophisticated resource assignments required by loaded-board testing, and is relatively easy and inexpensive to build and maintain. There is a further need for such an improved loaded-board, guided-probe test fixture that has improved probing accuracy, improved no-clean testability, and improved fine-pitch probing ability.

SUMMARY OF THE INVENTION

A test fixture for electrically connecting a plurality of limited-access test targets on a loaded circuit board with a plurality of interface probes of a tester may comprise a plurality of elongate test probes, a universal interface plate (UIP), and a wireless interface printed circuit board (WIPCB). A first end of each elongate test probe is substantially aligned with a limited-access target on the loaded circuit board when the test fixture is positioned adjacent the loaded circuit board. Each of a plurality of double-headed spring probes mounted to the UIP has a first spring loaded head located at its first end and a second spring loaded head located at its second end. Each double-headed spring probe is generally axially aligned with an elongate test probe so that its first spring loaded head contacts a second end of the corresponding elongate test probe. Each of a plurality of contact pads on the first side of the WIPCB is substantially aligned with a double-headed spring probe so that each contact pad contacts the second spring loaded head of the corresponding double-headed spring probe. Each of a plurality of contact targets on the second side of the WIPCB is electrically connected to a contact pad on the first side of the WIPCB and contacts an interface probe of the tester when the test fixture is mounted on the tester.

BRIEF DESCRIPTION OF THE DRAWINGS

The above and other objects, features and advantages of the present invention will be better understood by reading the following more particular description of the invention, presented in conjunction with the following drawings, wherein.

DETAILED DESCRIPTION OF THE PREFERRED EMBODIMENT

Figure 1:
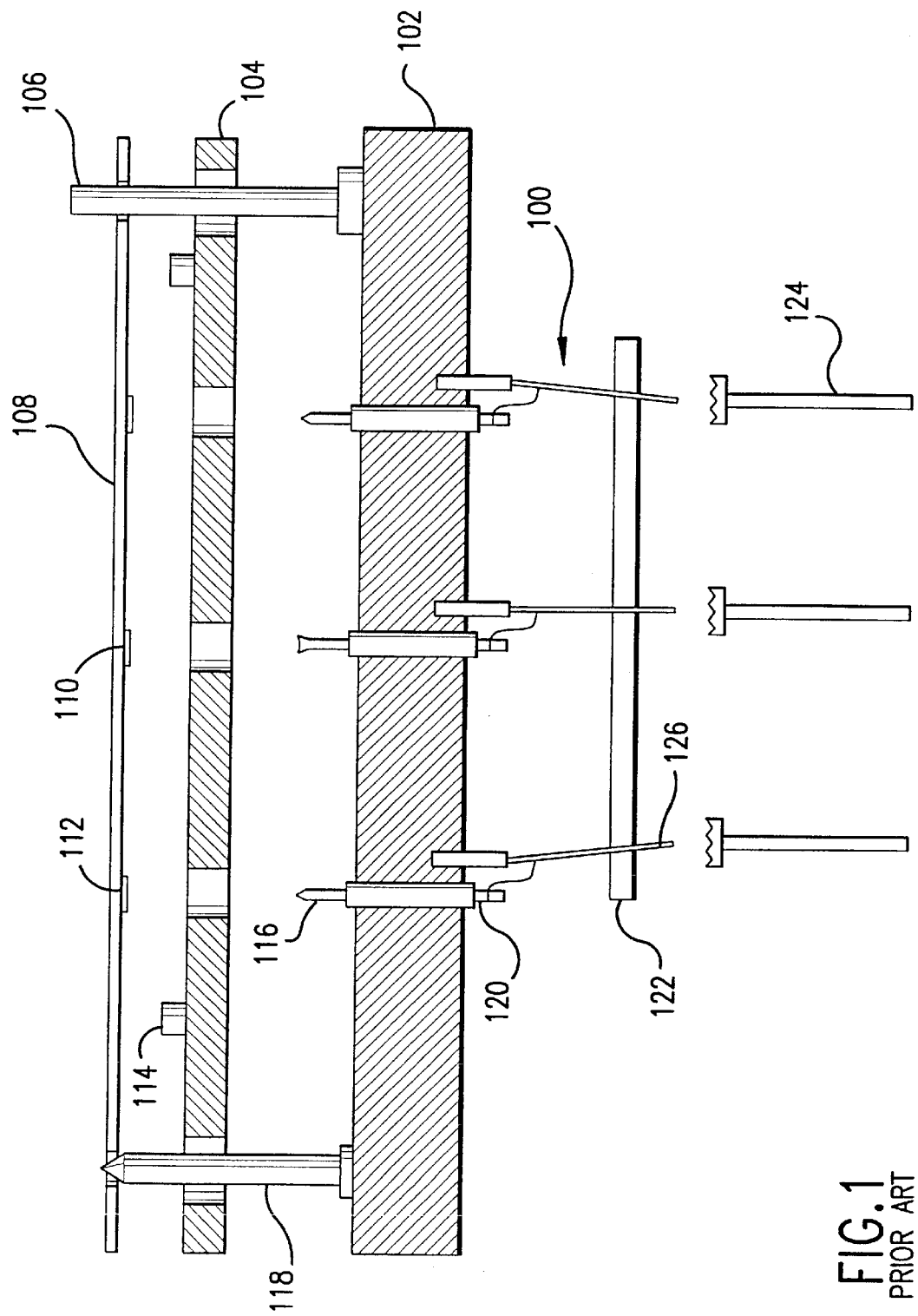
FIG. 1 shows a cut-away view of a conventional shortwire test fixture.
Figure 2:
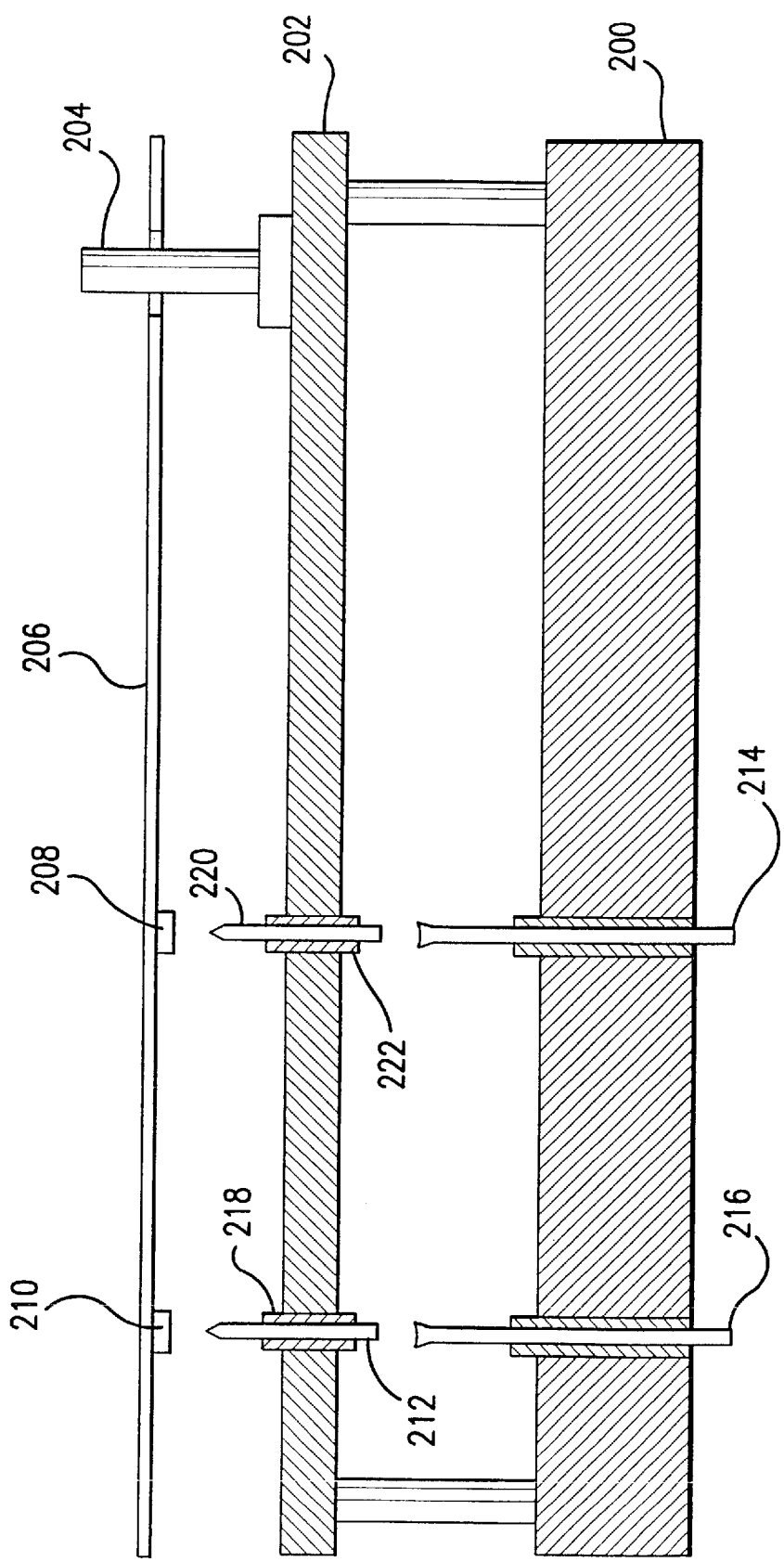
FIG. 2 shows a cut-away view of a conventional ultra-alignment test fixture.
Figure 3:
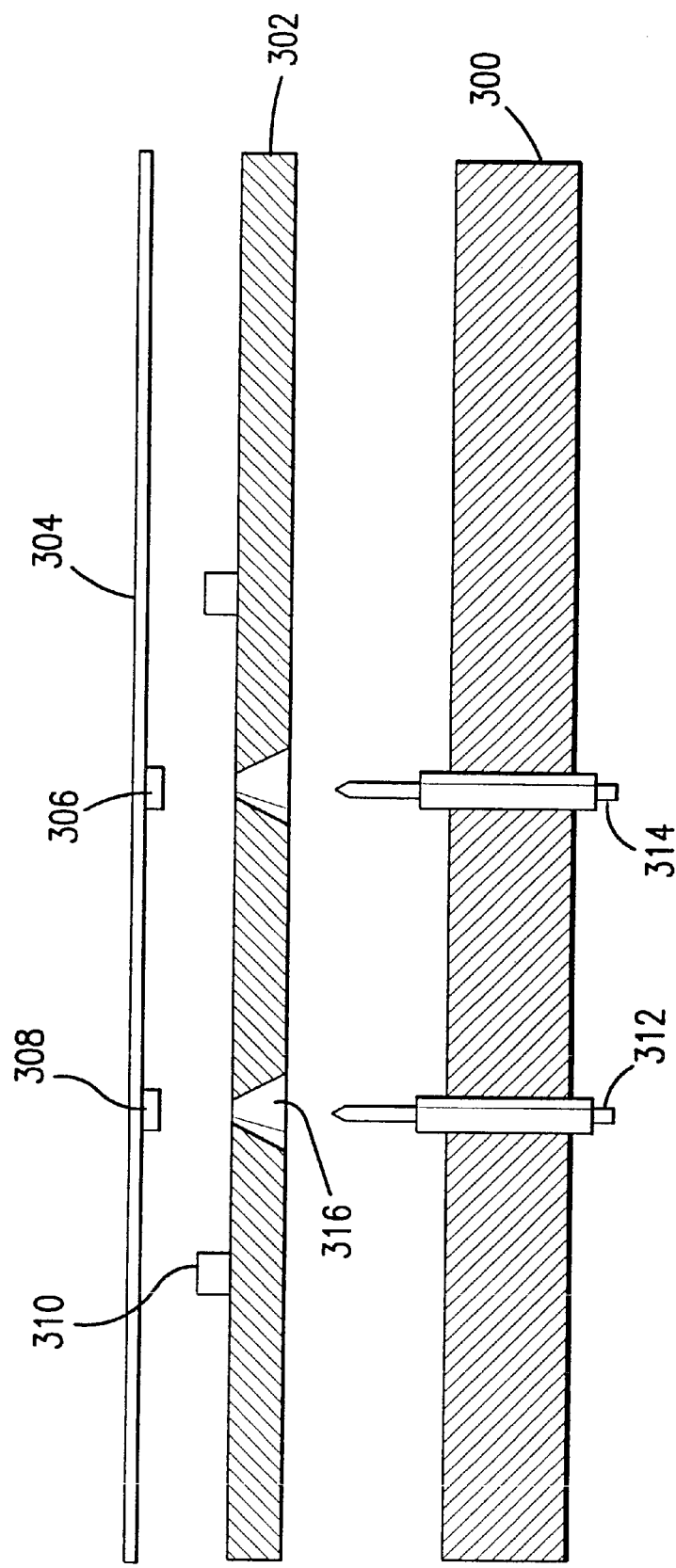
FIG. 3 shows a cut-away view of a conventional guided-probe protection plate fixture.
Figure 4:
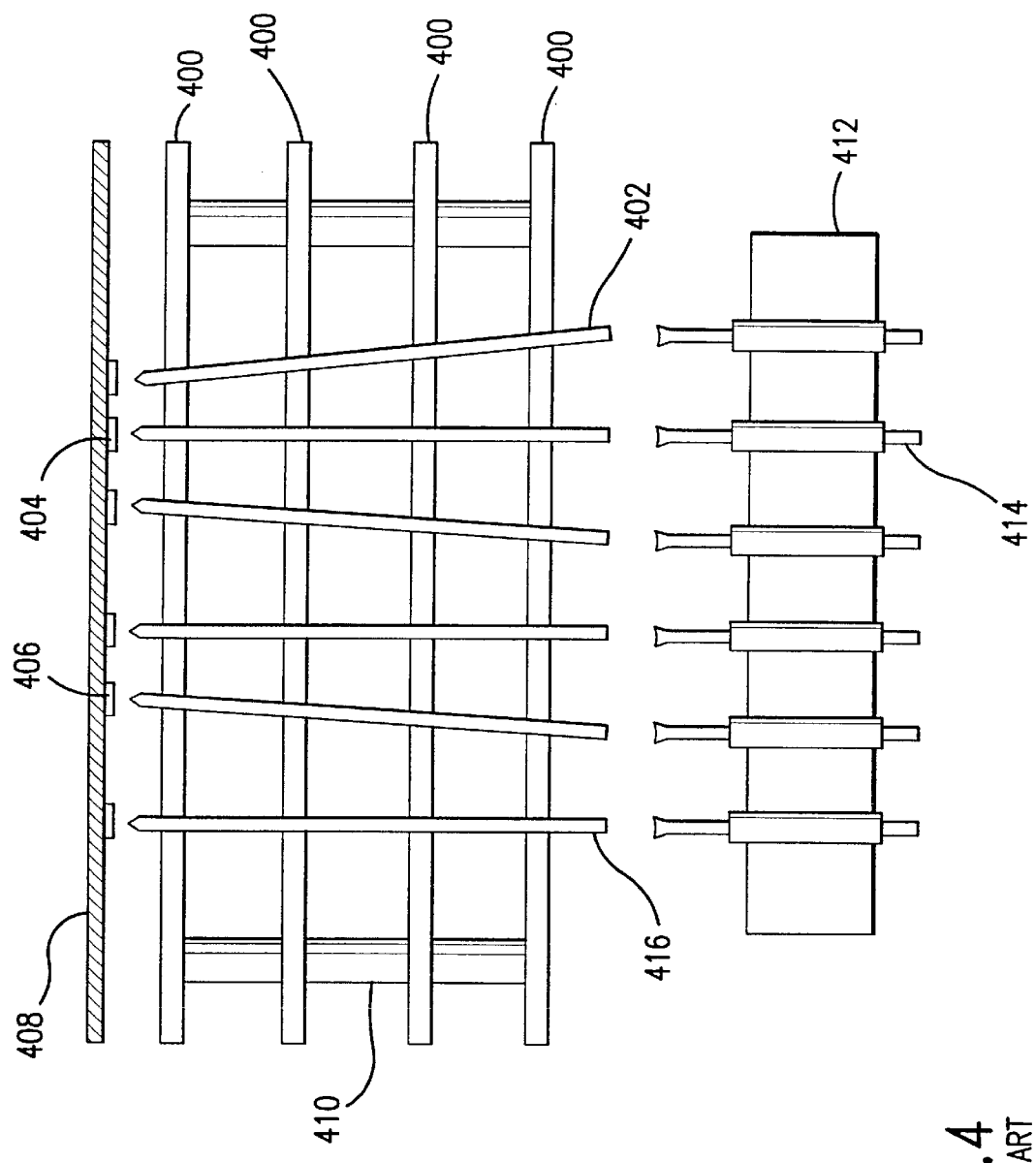
FIG. 4 shows a cut-away view of a conventional bare-board translator test fixture.
Figure 5:
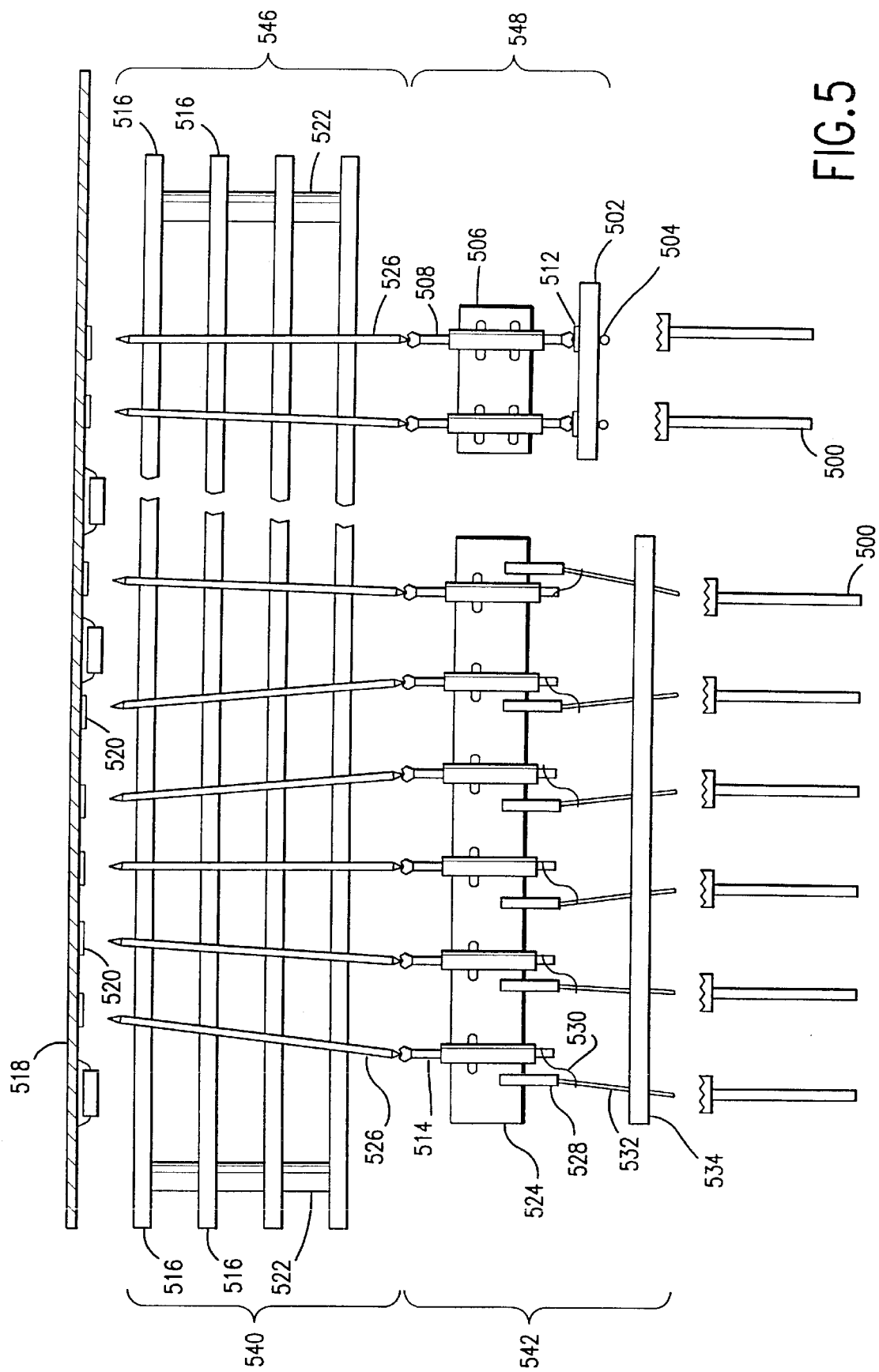
FIG. 5 shows a cut-away view of first and second embodiments of a loaded-board, guided-probe test fixture according to the present invention.

Referring to the schematic block diagram of FIG. 5, a first and a second embodiment of a loaded-board, guided-probe test fixture of the present invention are shown. The test fixture of the first embodiment comprises two major assemblies. The first assembly 540 is a translator fixture comprising a series of vertically spaced-apart and parallel guide plates 516, which are supported in parallel by solid posts 522 that hold the fixture together as a solid unit. The fixture also includes an array of leaning probes 526 extending through guide holes in the translator guide plates 516. The leaning probes 526 are in alignment on a first side of the translator fixture 540 with test targets 520 of a loaded circuit board 518. The leaning probes 526 are in alignment on a second side of the translator fixture 540 with spring probes 514 on a first side of a probe-mounting plate 524. The long leaning probes 526 are used to facilitate an easy transition from the fine-pitch targets 520 on the device under test 518 and larger pitch targets (spring probes 514) on the probe-mounting plate 524.

Probe-mounting plates are well known in the art; one such plate being a probe-mounting plate made of glass-reinforced epoxy. Personality pins 528 are embedded on a second side of the probe-mounting plate 524 and the personality pins 528 are electrically connected to the spring probes 514 by wires 530. The wirewrap posts 532 of the personality pins 528 pass through holes in an alignment plate 534 to make contact with interface probes 500 to the tester (not shown). Interface probes 500 of the tester are in a predetermined fixed, regularly spaced pattern. The alignment plate 534 aligns the wirewrap posts 532 of personality pins 528 to correspond to the predetermined location of the interface probes 500. The second major assembly 542 of the first embodiment is the unit of the probe-mounting plate 524 containing spring probes 514 and personality pins 528 and the alignment plate 534 which aligns the wirewrap posts 532 of the personality pins 528 with the interface probes 500.

Accurate alignment of the test fixture is essential for reliable operation. Alignment for the printed circuit board 518 to the translator fixture 540 is maintained by means of tooling pins (not shown), which is well known in the art of board test. Alignment between the translator fixture 540 and the probe-mounting plate 524 is maintained by means of alignment pins (not shown) or other known means. Alignment between the alignment plate 534 and the interface probes 500 is controlled through the mounting and locking hardware well known in the art of loaded-board test.

The method of operation of the test fixture is as follows. The translator assembly 540 is mounted on the probe-mounting plate/alignment plate assembly 542. The entire fixture, which includes the translator fixture 540 and the probe-mounting plate/alignment plate assembly 542 is then mounted on the regularly spaced interface probes 500 on the tester. Next the loaded printed circuit board 518 to be tested is placed on the translator fixture assembly 540 by means of tooling pins (not shown). The test targets 520 of the loaded-printed circuit board 518 are then brought into contact with the leaning probes 526 of the translator fixture assembly 540 by any of several known means, including vacuum, pneumatic or mechanical actuating means. As the printed circuit board 518 is drawn toward the tester (not shown), the leaning probes 526 are sandwiched between the test targets 520 of the printed circuit board 518 and the spring probes 514, thus making a good, low-resistance contact between the tips of leaning probes 526 and test targets 520. The spring force of the spring probes 514 helps the tips of leaning probes 526 make a good contact with the test sites 520, even if there is flux residue left on the printed circuit board 518 due to current no-clean, loaded-board manufacturing processes. Once electrical contact between the DUT and the leaning probes 526 is established, in-circuit or functional testing may commence.

The test fixture of the second embodiment comprises two major assemblies. The first assembly 546 is a translator fixture comprising a series of vertically spaced-apart and parallel guide plates 516, which are supported in parallel by solid posts 522 that hold the fixture together as a solid unit. The fixture 546 also includes an array of translator pins such as leaning probes 526 extending through guide holes in the translator plates 516. The leaning probes 526 are in alignment on a first side of the translator fixture 546 with test targets 520 on printed circuit board 518. The leaning probes 526 are in alignment on a second side of the translator fixture 546 with double-headed spring probes 508 on a first side of a probe-mounting plate 506.

Double-headed spring probes 508 extend through a second side of the probe-mounting plate 506 and make electrical contact with contact pads 512 on a wireless interface printed circuit board (WIPCB) 502. The contact pads 512 on the first side of the PCB 502 are electrically connected to contact targets 504 on a second side of the PCB 502. Contact targets 504 on the second side of the wireless interface PCB 502 are patterned to correspond with interface probes 500 of the tester (not shown). Interface probes 500 of the tester are in a predetermined fixed, regularly spaced pattern. The wireless interface PCB 502 allows the double-sided spring probes 508 to correspond to predetermined locations of the interface probes 500 by means of copper traces from the contact pads 512 that correspond to the locations of the double-headed spring probes 508 to contact targets 504 that correspond to the locations of the interface probes 500 of the tester. The second major assembly 548 of the second embodiment is the unit of the probe-mounting plate 506 containing double-sided spring probes 508 and the wireless interface PCB 502 which aligns the double-sided spring probes 508 with the interface probes 500.

Alignment for the printed circuit board 518 to the translator fixture 546 is maintained by means of tooling pins (not shown), which is well known in the art of board test. Alignment between the translator fixture 546 and the probe-mounting plate 506 is maintained by means of alignment pins (not shown) or other known means. Alignment between the probe-mounting plate 506 and the wireless interface PCB 502 is maintained by means or alignment pins (not shown) or by other known means. Alignment between the wireless, interface PCB 502 and the interface probes 500 is controlled through mounting and locking hardware well known in the art of loaded-board test.

The method of operation of the test fixture is as follows. The translator assembly 546 is mounted on the probe-mounting plate/wireless interface PCB assembly 548. The entire fixture, which includes the translator assembly 546 and the probe-mounting plate/wireless interface PCB assembly 548 is then mounted on the regularly spaced interface probes 500 on the tester. Next the loaded printed circuit board 518 to be tested is placed on the translator fixture assembly 546 by means of tooling pins (not shown). The test targets 520 of the loaded-printed circuit board 518 are then brought toward the tester by any of several known means, including vacuum, pneumatic or mechanical actuating means. As the printed circuit board 518 is drawn toward the tester, the leaning probes 526 are sandwiched between the test targets 520 of the printed circuit board 518 and the double-headed spring probes 508, thus making a good, low-resistance contact between the tips of leaning probes 526 and test targets 520. The spring force of the double-headed spring probes 508 helps the tips of leaning probes 526 make a good contact with the test sites 520, even if there is flux residue left on the printed circuit board 518 due to current no-clean loaded-board manufacturing processes.

Figure 6:
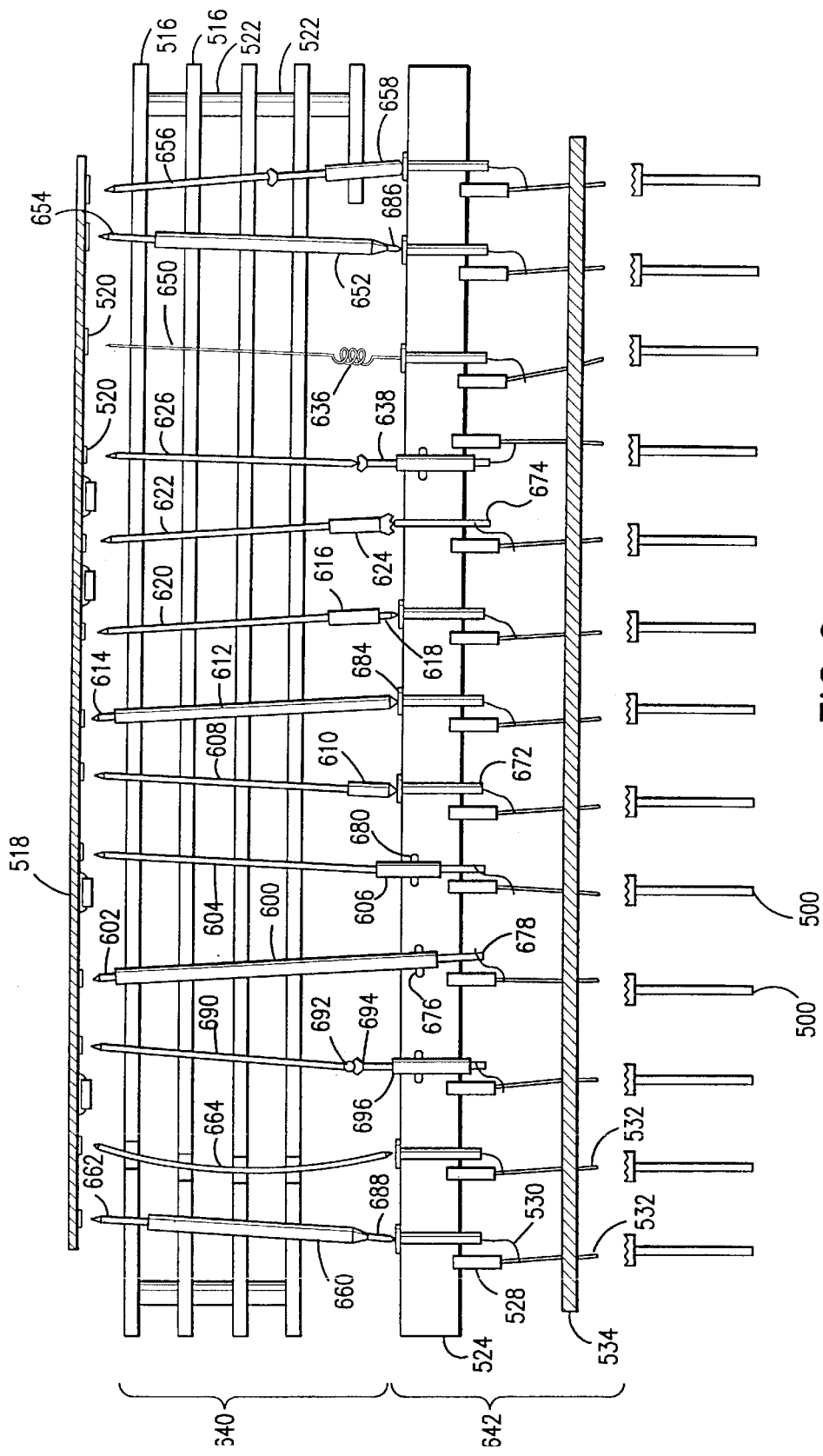
FIG. 6 shows a cut-away view of a third embodiment of a loaded-board, guided-probe test fixture according to the present invention.

Referring to the schematic block diagram of FIG. 6, a third embodiment of a loaded-board, guided-probe test fixture of the present invention is shown. Most of the components and features of FIG. 6 are similar to the components and features of FIG. 5, are numbered with the same numbers as in FIG. 5, and will not be explained again. The major difference between the embodiments of FIG. 5 and the embodiments of FIG. 6 are the different types of test probes that are used as will be explained below.

The test fixture of the third embodiment comprises two major assemblies. The first assembly 640 is a translator fixture, similar to assembly 540 in FIG. 5, comprising a series of vertically spaced-apart and parallel guide plates 516, which are supported in parallel by solid posts 522 that hold the fixture together as a solid unit. The fixture also includes an array of various long, leaning or vertical test probes extending through guide holes in the translator guide plates 516. The test probes are in alignment on a first side of the translator fixture 640 with test targets 520 of loaded circuit board 518. The test probes are in alignment on a second side of the translator fixture 640 with larger-pitch targets on a first side of a probe-mounting plate 524.

Personality pins 528 are embedded on a second side of the probe-mounting plate 524 and personality pins 528 are electrically connected to the various test probes by wires 530. The wirewrap posts 532 of the personality pins 528 pass through holes in an alignment plate 534 to make contact with interface probes 500 to the tester (not shown). Interface probes 500 of the tester are in a predetermined fixed, regularly spaced pattern. The alignment plate 534 aligns the wirewrap posts 532 of personality pins 528 to correspond to the predetermined location of the interface probes 500. The second major assembly 642 of the third embodiment is the unit of the probe-mounting plate 524 containing the various test probes and personality pins 528 and the alignment plate 534 which aligns the wirewrap posts 532 of the personality pins 528 with the interface probes 500.

Limited-access targets 520 are accessed by any of various types of long, leaning or vertical test probes 600, 604, 608, 612, 620, 622, 626, 650, 652, 656, 660, 664, and 690 that extend through holes in the guide plates 516. The long test probes 600, 604, 608, 612, 620, 622, 626, 650, 652, 656, 660, 664, and 690 are used to facilitate an easy transition from the fine-pitch targets 520 on the device under test 518 and larger-pitch targets on the probe-mounting plate 524 that are used to electrically connect test probes 600, 604, 608, 612, 620, 622, 626, 650, 652, 656, 660, 664, and 690 to personality pins 528 in the probe-mounting plate 524. Probe-mounting plates are well known in the art; one such plate being a glass-reinforced epoxy probe-mounting plate.

Long-socket spring test probe 600 includes a plunger 602 extending from a very long socket/barrel that is installed in probe-mounting plate 524 vertically or at an angle and extending through holes in guide plates 516. Press rings 676 may be located at the base of the socket installed in probe-mounting plate 524. Press rings 676 help keep the socket of test probe 600 securely in probe-mounting plate 524. The tip of plunger 602 corresponds to the location of a corresponding test target 520 in DUT 518. The long socket of test probe 600 contains a spring force means to hold the tip of plunger 602 in compressive contact with a corresponding test target 520 of DUT 518 when DUT 518 is brought into compressive contact therewith. A wirewrap post 678 of test probe 600 extends through probe-mounting plate 524 from a first side facing translator fixture 640 to a second side facing alignment plate 534. Wirewrap post 678 of test probe 600 is electrically connected to a corresponding personality pin 528 on the second side of probe-mounting plate 524 by means of wirewrap 530. Also, the socket of test probe 600 can be installed at specific predetermined depths within the probe-mounting plate 524 in order to accommodate unique probe and target geometries and heights.

Short-socket spring test probe 604 includes a very long plunger extending from a short socket/barrel 606 installed vertically in probe-mounting plate 524. The plunger may sit vertically or at an angle with respect to the socket 606. The plunger of test probe 604 extends through holes in guide plates 516. The tip of the plunger of test probe 604 corresponds to the location of a corresponding test target 520 on DUT 518. Press rings 680 help keep the socket 606 securely mounted in probe-mounting plate 524. A wirewrap post 682 of socket 606 extends through probe-mounting plate 524 from the first side to the second side. Wirewrap post 682 of test probe 604 is electrically connected to a corresponding personality pin 528 on the second side of probe-mounting plate 524 by means of wirewrap 530. Socket 606 contains a spring force means to hold the tip of the plunger in compressive contact with a corresponding test target 520 when the DUT 518 is brought into engagement therewith. Also, the socket 606 of test probe 604 can be installed at specific predetermined depths within the probe-mounting plate 524 in order to accommodate unique probe and target geometries and heights.

Test probe 608 includes a solid plunger extending from within a self-actuating spring probe that includes socket/barrel 610 with a spring force means inside of it. Test probe 608 sits atop a corresponding personality peg 672 that is installed in probe-mounting plate 524. The solid plunger extends through holes in guide plates 516. The tip of the plunger corresponds to the location of a corresponding test target 520 on DUT 518. Personality peg 672 extends through the probe-mounting plate 524 from the first side which faces the translator fixture 640 to a second side which faces alignment plate 534. Personality peg 672 is electrically connected to personality pin 528 on the second side of the probe-mounting plate 524 by means of wirewrap 530.

Test probe 612 includes a plunger 614 extending from a long socket having a flat, rounded or pointed end 684 that sits atop a corresponding shortwire personality peg 672. The long socket extends through holes in guide plates 516. The tip of plunger 614 corresponds to the location of a corresponding test target 520 on DUT 518. The long socket includes a spring means that holds the tip of plunger 614 in compressive contact with the corresponding test target 520 when the DUT 518 is brought into contact therewith. Personality peg 672 extends through probe-mounting plate 524 from the first side to the second side. Personality peg 672 is electrically connected to personality pin 528 on the second side of probe-mounting plate 524 by means of wirewrap 530.

Test probe 620 includes a long plunger extending through guide plates 516 from a first side of double-sided socket/barrel 616. Test probe 620 also includes a short plunger 618 extending from a second side of double-headed socket 616 and sitting atop a corresponding shortwire personality peg 672. Double-headed socket 616 includes a spring force means that holds the tip of the long plunger of test probe 620 in compressive contact with a corresponding test target 520 and the tip of short plunger 618 in compressive contact with personality peg 672 when the DUT 518 is brought into contact therewith. Personality peg 672 extends through probe-mounting plate 524 from the first side to the second side. Personality peg 672 is electrically connected to personality pin 528 on the second side of probe-mounting plate 524 by means of wirewrap 530.

Test probe 622 includes a solid plunger extending from within a waffle-ended socket/barrel 624 which rests atop a personality post 674 installed in probe-mounting plate 524. Waffle-ended socket 624 includes a spring force means for holding the tip of the plunger in compressive contact with a corresponding test target 520 when the DUT 518 is brought into contact therewith. Personality post 674 extends through the probe-mounting plate 524 from the first side which faces the translator fixture 640 to a second side which faces alignment plate 534. Personality post 674 is electrically connected to its corresponding personality pin 528 on the second side of the probe-mounting plate 524 by means of wirewrap 530.

Test probe 626 includes a solid probe resting atop and actuated by a spring probe 638 installed in probe-mounting plate 524. Spring probe 638 contains a spring force means for holding the tip of the solid probe in compressive contact with a corresponding test target 520 when DUT 518 is brought into contact therewith. Spring probe 638 extends through the probe-mounting plate 524 from the first side which faces the translator fixture 640 to a second side which faces alignment plate 534. Spring probe 638 is electrically connected to its corresponding personality pin 528 on the second side of the probe-mounting plate 524 by means of wirewrap 530. Spring probe 638 may also include press rings as described above with respect to test probes 600 and 604.

Test probe 650 includes a solid plunger with a built-in spring 636. Test probe 650 is a single unit and lacks a housing or socket. Test probe 650 sits atop a corresponding shortwire personality peg 672 and extends through holes in guide plates 516. A tip of test probe 650 is held in compressive contact with a corresponding test target 520 of DUT 518 by the spring force of spring 636 when the DUT 518 is brought into contact therewith. Personality peg 672 extends through probe-mounting plate 524 from the first side to the second side. Personality peg 672 is electrically connected to personality pin 528 on the second side of probe-mounting plate 524 by means of wirewrap 530.

Test probe 652 includes a plunger 654 extending from a first side of a long, double-sided socket. Test probe 652 also includes a short plunger 686 extending from a second side of the double-sided socket and sitting atop a corresponding personality peg 672. The double-sided socket includes a spring force means that compressively holds test probe 652 between test target 520 and personality peg 672 when DUT 518 is brought into compressive contact therewith. Personality peg 672 extends through probe-mounting plate 524 from the first side to the second side. Personality peg 672 is electrically connected to personality pin 528 on the second side of probe-mounting plate 524 by means of wirewrap 530.

Test probe 656 includes a solid probe resting atop a spring probe 658 that rests atop a corresponding personality peg 672. It should be noted that since neither the solid probe nor the spring probe 658 are installed in probe-mounting plate 524, the solid probe must extend through at least two guide plates 516 and the spring probe 658 must extend through at least two guide plate 516 in order to effectively maintain the position of test probe 656. The tip of the solid probe of test probe 656 is held in compressive contact with a corresponding test target 520 by the spring force of spring probe 658 when DUT 518 is brought into contact therewith. Personality peg 672 extends through probe-mounting plate 524 from the first side to the second side. Personality peg 672 is electrically connected to personality pin 528 on the second side of probe-mounting plate 524 by means of wirewrap 530.

Test probe 660 includes a plunger 662 extending from a first side of a long socket. Test probe 660 also includes a wirewrap tail 688 extending from a second side of the socket and sitting atop a corresponding personality peg 672. The socket includes a spring force means that compressively holds test probe 660 between test target 520 and contact personality peg 672 when DUT 518 is brought into compressive contact therewith. Personality peg 672 extends through probe-mounting plate 524 and is electrically connected to personality pin 528 by means of wirewrap 530.

Test probe 664 comprises a flexible, solid probe that extends through holes in guide plates 516. Test probe 664 has a first end that contacts a corresponding test target 520 on DUT 518 and a second end that contacts a corresponding personality peg 672 on probe-mounting plate 524. The holes in guide plates 516 are located at predetermined locations such that when test probe 664 is in compressive contact with a corresponding test target 520 of DUT 518 and a corresponding personality peg 672 of probe-mounting plate 524, test probe 664 will bend compressively, but maintain contact with its corresponding test target 520 and personality peg 672. Personality peg 672 extends through probe-mounting plate 524 and is electrically connected to its corresponding personality pin 528 by means of wirewrap 530.

Test probe 690 includes a long, solid probe having a tip at a first end that contacts a corresponding test target 520 on DUT 518 and a ball 692 at a second end that mates with a plunger 694 of spring probe 696 mounted in probe-mounting plate 524. Spring probe 696 contains a spring force means to hold the tip of the long, solid probe in compressive contact with a corresponding test target 520 when the DUT 518 is brought into compressive contact therewith. Spring probe 696 extends through probe-mounting plate 524 and is electrically connected to its corresponding personality pin 528 by means of wirewrap 530.

The test probes 600, 604, 608, 612, 620, 622, 626, 650, 652, 656, 660, 664, and 690 are in alignment on the first side of the translator fixture 640 with test targets 520 of loaded-circuit board under test 518. The test probes 600, 604, 608, 612, 620, 622, 626, 650, 652, 656, 660, 664, and 690 are in alignment on the second side of the translator fixture 640 with larger-pitch targets.

Alignment of the DUT 518 to the translator fixture 640 is maintained by means of tooling pins (not shown), which is well known in the art of board test. Alignment between the translator fixture 640 and the probe-mounting plate 524 is maintained by means of alignment pins (not shown) or other known means. Alignment between the alignment plate 534 and the interface probes 500 is controlled through the mounting and locking hardware well known in the art of loaded-board test.

The method of operation of the test fixture is as follows. The translator assembly 640 is mounted on the probe-mounting plate/alignment plate assembly 642. The entire fixture, which includes the translator fixture 640 and the probe-mounting plate/alignment plate assembly 642 is then mounted on the regularly spaced interface probes 500 on the tester. Next the loaded printed circuit board 518 to be tested is placed on the translator fixture 640 by means of tooling pins (not shown). The test targets 520 of the loaded-printed circuit board 518 are then brought into contact with the test probes 600, 604, 608, 612, 620, 622, 626, 650, 652, 656, 660, 664, and 690 of the translator fixture 640 by any of several known means, including vacuum, pneumatic or mechanical actuating means.

As the printed circuit board 518 is drawn toward the tester (not shown), the test probes 600, 604, 608, 612, 620, 622, 626, 650, 652, 656, 660, 664, and 690 are sandwiched between the test targets 520 of the DUT 518 and the larger-pitch targets on probe-mounting plate 524, thus making a good, low-resistance contact between the tips of the test probes 600, 604, 608, 612, 620, 622, 626, 650, 652, 656, 660, 664, and 690 and the limited-access test targets 520. The wiping action of tips of leaning test probes 600, 604, 608, 612, 620, 622, 626, 650, 652, 656, 660, 664, and 690 across the targets 520 and the spring force of the various test probes 600, 604, 608, 612, 620, 622, 626, 650, 652, 656, 660, 664, and 690 helps the tips of test probes 600, 604, 608, 612, 620, 622, 626, 650, 652, 656, 660, 664, and 690 make a good contact with the test targets 520, even if there is flux residue left on the printed circuit board 518 due to current no-clean, loaded-board manufacturing processes. Once electrical contact between the DUT and the various corresponding test probes is established, in-circuit or functional testing may commence.

There are actually two anticipated methods to initiate full electrical contact between the test targets 520 and the interface probes 500 on the tester. One method involves placing the DUT 518 directly on the tips of the test probes and then pushing the DUT 518 and the guide plates 516 toward the probe-mounting plate/alignment plate assembly 642, where the translator fixture unit 640 and the probe-mounting plate/alignment plate unit 642 of the test fixture are aligned with tooling pins, but can move in the vertical direction in relation to each other. The second method involves placing the DUT 518 directly on the tips of the test probes and then pushing the DUT 518 towards the entire fixture, where the translator portion 640 and the probe-mounting plate/alignment plate portion 642 are fixedly secured to one another by spacers (not shown). As the DUT 518 is brought into compressive contact with the test fixture, the spring force of the various test probes will maintain compressive contact between each of the test probes and its corresponding test target 520, regardless of the varying height and geometries of the different test targets 520 of DUT 518.

The proposed test fixture of the present invention can probe a mixture of standard-access and limited-access targets 520. Long, leaning or vertical test probes 600, 604, 608, 612, 620, 622, 626, 650, 652, 656, 660, 664, and 690, guide plates 516 and limited probe tip travel improve the test fixture's ability to probe small, fine-pitch targets 520. Personality pins 528 and alignment plate 534 provide complex tester resource allocation.

Figure 7:
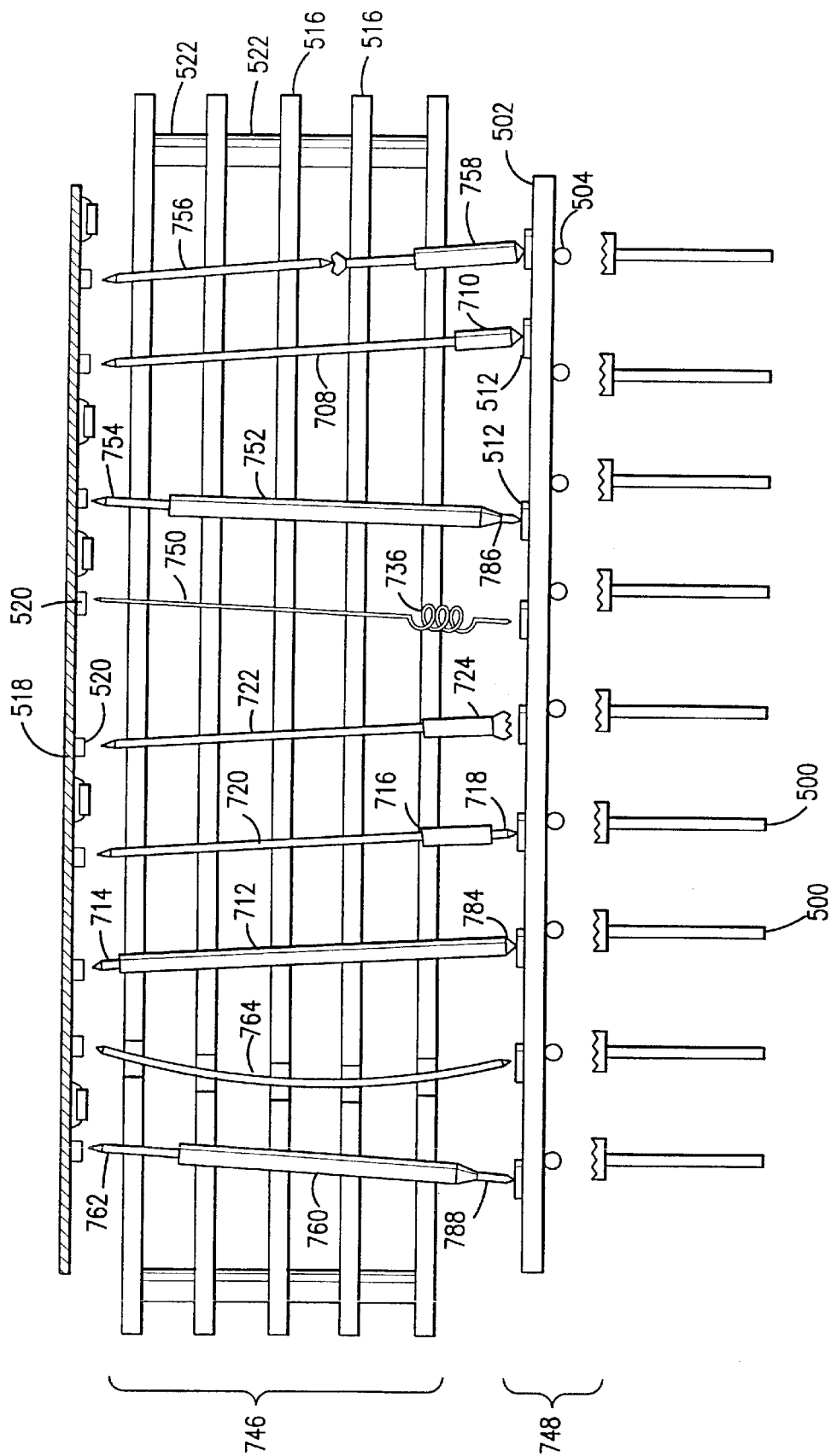
FIG. 7 shows a cut-away view of a fourth embodiment of a loaded-board, guided-probe test fixture with a wireless interface printed circuit board according to the present invention.

Referring to FIG. 7, the test fixture of the fourth embodiment comprises two major assemblies. The first assembly 746 is a translator fixture, similar to assembly 546 in FIG. 5, comprising a series of vertically spaced-apart and parallel guide plates 516, which are supported in parallel by solid posts 522 that hold the fixture together as a solid unit. The fixture also includes an array of various long, leaning or vertical test probes extending through guide holes in the translator plates 516. The test probes are in alignment on a first side of the translator fixture 746 with test targets 520 of loaded circuit board 518. The test probes are in alignment on a second side of the translator fixture 746 with larger-pitch contact pads 512 on a first side of a wireless interface printed circuit board (WIPCB) 502.

The contact pads 512 on wireless interface printed circuit board 502 are electrically connected to contact targets 504 on a second side of the WIPCB 502. Contact targets 504 on the second side of WIPCB 502 are patterned to correspond with interface probes 500 of the tester (not shown). Interface probes 500 of the tester are in a predetermined fixed, regularly spaced pattern. The WIPCB 502 allows the various limited-access test probes to correspond to predetermined locations of the interface probes 500 by means of copper traces (not shown) from the contact pads 512 that correspond to the locations of the test probes to the contact targets 504 that correspond to the locations of the interface probes 500 of the tester. The second major assembly 748 of the fourth embodiment of the present invention is the wireless interface printed circuit board 502 which aligns the limited-access test probes with the interface probes 500.

Limited-access targets 520 are accessed by any of various types of long, leaning or vertical test probes 708, 712, 720, 722, 750, 752, 756, 760, and 764 that extend through holes in guide plates 516. The test probes 708, 712, 720, 722, 750, 752, 756, 760, and 764 are used to facilitate an easy transition from the fine-pitch targets 520 on the device under test 518 to the larger-pitch targets 512 on the WIPCB 502 that are electrically connected to contact pads 504 via copper traces (not shown).

Test probe 708 includes a solid plunger extending from within a self-actuating spring probe that includes socket 710 with a spring force means inside of it. Test probe 708 sits atop a corresponding contact pad 512 on WIPCB 502. The tip of the solid plunger of test probe 708 is held in compressive contact with a corresponding test target 520 by the spring force means in socket 710 when DUT 518 is brought into compressive contact therewith. Contact pad 512 is electrically connected to contact target 504 on the second side of the WIPCB 502 by means of a copper trace (not shown).

Test probe 712 includes a plunger 714 extending from a long socket having a flat, rounded or pointed end 784 that sits atop a corresponding contact pad 512 on WIPCB 502. The long socket extends through holes in guide plates 516. A tip of plunger 714 corresponds to the location of a corresponding test target 520 on DUT 518. The long socket includes a spring means that holds the tip of plunger 714 in compressive contact with the corresponding test target 520 when the DUT 518 is brought into compressive contact therewith. Contact pad 512 is electrically connected to contact target 504 on the second side of the WIPCB 502 by means of a copper trace (not shown).

Test probe 720 includes a long plunger extending through guide plates 516 from a first side of double-headed socket/barrel 716. Test probe 720 also includes a short plunger 718 extending from a second side of double-headed socket 716 and sitting atop a corresponding contact pad 512 on WIPCB 502. Double-headed socket 716 includes a spring force means that holds the tip of the long plunger of test probe 720 in compressive contact with a corresponding test target 520 and the tip of short plunger 718 in compressive contact with its corresponding contact pad 512 on WIPCB 502 when the DUT 518 is brought into compressive contact therewith. Contact pad 512 is electrically connected to contact target 504 on the second side of the WIPCB 502 by means of a copper trace (not shown).

Test probe 722 includes a solid plunger extending from within a waffle-ended socket/barrel 724 which rests atop a contact pad 512 on WIPCB 502. Waffle-ended socket 724 includes a spring force means for holding the test probe 722 in compressive contact between its corresponding test target 520 and its corresponding contact pad 512 on the WIPCB 502 when the DUT 518 is brought into compressive contact therewith. Contact pad 512 is electrically connected to contact target 504 on the second side of the WIPCB 502 by means of a copper trace (not shown).

Test probe 750 includes a plunger with a built-in spring 736. Test probe 750 is a single unit and lacks a housing or socket. Test probe 750 sits atop a corresponding contact pad 512 on WIPCB 502 and extends through holes in guide plates 516. Test probe 750 is held in compressive contact between its corresponding test target 520 of DUT 518 and its corresponding contact pad 512 on WIPCB 502 by the spring force of spring 736 when the DUT 518 is brought into compressive contact therewith. Contact pad 512 is electrically connected to contact target 504 on the second side of the WIPCB 502 by means of a copper trace (not shown).

Test probe 752 includes a plunger 754 extending from a first side of a long, double-headed socket. Test probe 752 also includes a short plunger 786 extending from a second side of the double-headed socket and sitting atop a corresponding contact pad 512 on WIPCB 502. The double-headed socket includes a spring force means that compressively holds test probe 752 between its corresponding test target 520 and its corresponding contact pad 512 on WIPCB 502 when DUT 518 is brought into compressive contact therewith. Contact pad 512 is electrically connected to contact target 504 on the second side of the WIPCB 502 by means of a copper trace (not shown).

Test probe 756 includes a solid probe resting atop a spring probe 758 that rests atop a corresponding contact pad 512 on WIPCB 502. It should be noted that both the solid probe and the spring probe 758 must extend through at least two guide plates 516 in order to securely maintain the position of test probe 756. The tip of the solid probe of test probe 756 is held in compressive contact with a corresponding test target 520 by the spring force of spring probe 758 when DUT 518 is brought into compressive contact therewith. Contact pad 512 is electrically connected to contact target 504 on the second side of WIPCB 502 by means of a copper trace (not shown).

Test probe 760 includes a plunger 762 extending from a first side of a long, socket. Test probe 760 also includes a wirewrap tail 788 extending from a second side of the socket and sitting atop a corresponding contact pad 512 on WIPCB 502. The socket includes a spring force means that compressively holds test probe 760 between its corresponding test target 520 and its corresponding contact pad 512 on WIPCB 502 when DUT 518 is brought into compressive contact therewith. Contact pad 512 is electrically connected to contact target 504 on the second side of WIPCB 502 by means of a copper trace (not shown).

Test probe 764 comprises a flexible, solid probe that extends through holes in guide plates 516. Test probe 764 has a first end that contacts its corresponding test target 520 on DUT 518 and a second end that contacts its corresponding contact pad 512 on WIPCB 502. The holes in guide plates 516 are located at predetermined locations such that when test probe 764 is in compressive contact with its corresponding test target 520 of DUT 518 and its corresponding contact pad 512 on WIPCB 502, test probe 764 will bend compressively, but maintain contact with its corresponding test target 520 and contact pad 512. Contact pad 512 is electrically connected to contact target 504 on the second side of WIPCB 502 by means of a copper trace (not shown).

It should be noted that other types of test probes may be used in conjunction with the fourth embodiment of the present invention. The fourth embodiment basically pertaining to long, leaning or vertical self-actuating spring probes directed by guide plates 516 and making electrical contact with tester interface probes 500 by means of contact pads 512, wire traces (not shown) and contact targets 504 of a wireless interface printed circuit board 502.

Alignment for the printed circuit board 518 to the translator fixture 746 is maintained by means of tooling pins (not shown), which is well known in the art of board test. Alignment between the translator fixture 746 and the wireless interface PCB 502 is maintained by means of alignment pins (not shown) or by other known means. Alignment between the wireless interface PCB 502 and the interface probes 500 is controlled through mounting and locking hardware well known in the art of loaded-board testers.

The method of operation of the test fixture is as follows. The translator assembly 746 is mounted on the WIPCB assembly 748. The entire fixture, which includes the translator assembly 746 and the WIPCB assembly 748 is then mounted on the regularly spaced interface probes 500 on the tester. Next the loaded printed circuit board 518 to be tested is placed on the translator assembly 746 by means of tooling pins (not shown). The test targets 520 of the loaded-printed circuit board 518 are then brought toward the tester by any of several known means, including vacuum, pneumatic or mechanical actuating means. As the printed circuit board 518 is drawn toward the tester, the test probes are sandwiched between the test targets 520 of the printed circuit board 518 and the contact pads 512 of the WIPCB 502, thus making a good, low-resistance contact between the tips of the test probes and the test targets 520. The wiping action of the tips of the various leaning test probes across test targets 520 and the spring force of the test probes helps the tips of the test probes make good contact with the test targets 520, even if there is flux residue left on the printed circuit board 518 due to current no-clean loaded-board manufacturing processes.

Figure 8:
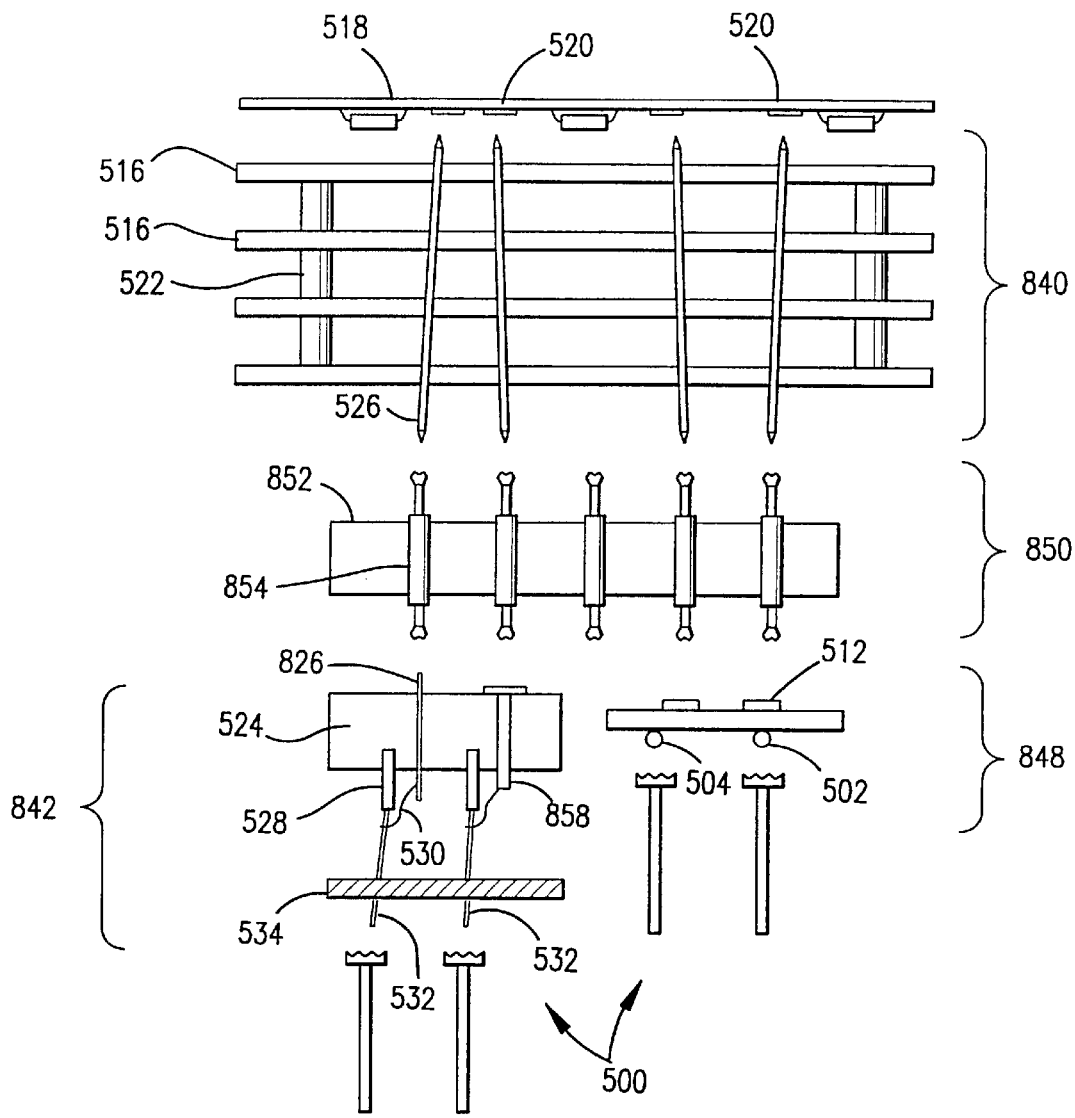
FIG. 8 shows a cut-away view of fifth and sixth embodiments of a loaded-board, guided-probe test fixture with a universal interface plate according to the present invention.

Referring to the schematic block diagram of FIG. 8, a fifth and a sixth embodiment of a loaded-board, guided-probe test fixture of the present invention are shown. Most of the components and features of FIG. 8 are similar to the components and features of FIGS. 5, 6 and 7 above, are numbered with the same numbers, and will not be explained again. The major differences between the embodiments of FIG. 8 and FIGS. 5, 6 and 7 will be explained below.

The test fixture of the fifth embodiment comprises three major assemblies. The first major assembly 840 is a translator fixture comprising a series of vertically spaced-apart and parallel guide plates 516, which are supported in parallel by solid posts 522 that hold the fixture together as a solid unit. The fixture also includes an array of leaning probes 526 extending through guide holes in the translator guide plates 516. The leaning probes 526 are in alignment on a first side of the translator fixture 840 with test targets 520 of a loaded circuit board 518. The leaning probes 526 are in alignment on a second side of the translator fixture 840 with double-headed spring probes 854 on a first side of a universal interface plate 852. The long leaning probes 526 are used to facilitate an easy transition from the fine-pitch targets 520 on the device under test 518 and larger-pitch targets (double-headed spring probes 854) on the universal interface plate 852, the second major assembly 850 of the fifth embodiment being the universal interface plate 852.

Double-headed spring probes 854 extend through a second side of the universal interface plate 852 and make electrical contact with either personality posts 856 or personality pegs 858 mounted in probe-mounting plate 524. Probe-mounting plates are well known in the art; one such plate being a probe-mounting plate made of glass-reinforced epoxy. Personality posts 856 and personality pegs 858 extend through to a second side of the probe-mounting plate 524.

Personality pins 528 are embedded on the second side of the probe-mounting plate 524 and the personality pins 528 are electrically connected to at least one of the personality posts 856 or personality pegs 858 by short wires 530. The wirewrap posts 532 of the personality pins 528 pass through holes in an alignment plate 534 to make contact with interface probes 500 of the tester (not shown). Interface probes 500 of the tester are in a predetermined fixed, regularly spaced pattern. The alignment plate 534 aligns the wirewrap posts 532 of personality pins 528 to correspond to the predetermined location of the interface probes 500. The third major assembly 842 of the fifth embodiment is the unit of the probe-mounting plate 524 containing personality posts 856 and/or personality pegs 858 and personality pins 528 and the alignment plate 534 which aligns the wirewrap posts 532 of the personality pins 528 with the interface probes 500.

Accurate alignment of the test fixture is essential for reliable operation. Alignment for the printed circuit board 518 to the translator fixture 840 is maintained by means of tooling pins (not shown), which is well known in the art of board test. Alignment between the translator fixture 840, the universal interface plate 852, and the probe-mounting plate/alignment plate assembly 842 is maintained by means of alignment pins (not shown) or other known means. Alignment between the alignment plate 534 and the interface probes 500 is controlled through the mounting and locking hardware well known in the art of loaded-board test.

The method of operation of the test fixture is as follows. The translator assembly 840 is mounted on the universal interface plate 852 which is mounted on the probe-mounting plate/alignment plate assembly 842. The entire fixture, which includes the translator fixture 840, the universal interface plate 852, and the probe-mounting plate/alignment plate assembly 842, is then mounted on the regularly spaced interface probes 500 on the tester. Next the loaded printed circuit board 518 to be tested is placed on the translator fixture 840 by means of tooling pins (not shown). The test targets 520 of the loaded-printed circuit board 518 are then brought into contact with the leaning probes 526 of the translator fixture 840 by any of several known means, including vacuum, pneumatic or mechanical actuating means.

As the printed circuit board 518 is drawn toward the tester (not shown), the leaning or vertical probes 526 are sandwiched between the test targets 520 of the printed circuit board 518 and the double-headed spring probes 854, thus making a good, low-resistance contact between the tips of leaning probes 526 and test targets 520. The wiping action of the tips of the leaning, solid probes 526 across the test targets 520 and the spring force of the spring probes 854 helps the tips of leaning probes 526 make a good contact with the test targets 520, even if there is flux residue left on the printed circuit board 518 due to current no-clean, loaded-board manufacturing processes. Once electrical contact between the DUT and the leaning probes 526 is established, in-circuit or functional testing may commence.

The test fixture of the sixth embodiment comprises three major assemblies. The first assembly 840 is a translator fixture comprising a series of vertically spaced-apart and parallel guide plates 516, which are supported in parallel by solid posts 522 that hold the fixture together as a solid unit. The translator fixture 840 also includes an array of translator pins such as leaning or vertical probes 526 extending through guide holes in the guide plates 516. The leaning or vertical probes 526 are in alignment on a first side of the translator fixture 840 with test targets 520 on printed circuit board 518. The leaning or vertical probes 526 are in alignment on a second side of the translator fixture 840 with double-headed spring probes 854 on a first side of a universal interface plate 852. The second major assembly 850 of the sixth embodiment being the universal interface plate 852.

Double-headed spring probes 854 extend through a second side of the universal interface plate 852 and make electrical contact with contact pads 512 on a wireless interface printed circuit board (WIPCB) 502. The contact pads 512 on the first side of the PCB 502 are electrically connected to contact targets 504 on a second side of the PCB 502. Contact targets 504 on the second side of the WIPCB 502 are patterned to correspond with interface probes 500 of the tester (not shown). Interface probes 500 of the tester are in a predetermined fixed, regularly spaced pattern. The wireless interface PCB 502 allows the double-headed spring probes 854 to correspond to the predetermined locations of the interface probes 500 by means of copper traces from the contact pads 512 that correspond to the locations of the double-headed spring probes 854 to contact targets 504 that correspond to the locations of the interface probes 500 of the tester. The third major assembly 848 of the sixth embodiment is the unit of the WIPCB 502 which aligns the double-headed spring probes 854 with the interface probes 500.

Alignment for the printed circuit board 518 to the translator fixture 840 is maintained by means of tooling pins (not shown), which are well known in the art of board test. Alignment between the translator fixture 840 and the universal interface plate 852 is maintained by means of alignment pins (not shown) or other known means. Alignment between the universal interface plate 852 and the wireless interface PCB 502 is maintained by means or alignment pins (not shown) or by other known means. Alignment between the wireless interface PCB 502 and the interface probes 500 is controlled through mounting and locking hardware well known in the art of loaded-board test.

The method of operation of the test fixture is as follows. The translator assembly 840 is mounted on the universal interface plate 850/WIPCB assembly 848. The entire fixture, which includes the translator assembly 840 and the universal interface plate 850/WIPCB assembly 848, is then mounted on the regularly spaced interface probes 500 on the tester. Next the loaded printed circuit board 518 to be tested is placed on the translator assembly 840 by means of tooling pins (not shown). The test targets 520 of the loaded-printed circuit board 518 are then brought toward the tester by any of several known means, including vacuum, pneumatic or mechanical actuating means.

As the printed circuit board 518 is drawn toward the tester, the leaning or vertical, solid probes 526 are sandwiched between the test targets 520 of the printed circuit board 518 and the double-headed spring probes 854, thus making a good, low-resistance contact between the tips of leaning or vertical, solid probes 526 and test targets 520. The wiping action of the leaning, solid probes 526 across the test targets 520 and the spring force of the double-headed spring probes 854 helps the tips of leaning probes 526 make a good contact with the test targets 520, even if there is flux residue left on the printed circuit board 518 due to current no-clean loaded-board manufacturing processes.

The foregoing description of the present invention has been presented for purposes of illustration and description. It is not intended to be exhaustive or to limit the invention to the precise form disclosed, and other modifications and variations may be possible in light of the above teachings. For example, the translator fixture could be milled out to accommodate even more types of test probes, such as the larger capacitive and inductive type test probes. Also, two guided-probe test fixtures could be used in a clamshell type tester in order to test printed circuit boards that are populated with electronic components on both sides or have test targets on both sides.

Furthermore, self-actuating test probes may come in many configurations, so long as the probes provide an electrical path between test targets 520 on the printed circuit board 518 and targets below.

Still further, the guided-probe test fixture of the present invention could be used in conjunction with an automatic tester in order to test printed circuit boards that are populated with electronic components on both sides or have test targets on both sides. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A test fixture for electrically connecting a plurality of limited-access test targets on a loaded circuit board with a plurality of interface probes of a tester, comprising:

a plurality of elongate test probes, each of said plurality of elongate test probes having a first end and a second end, the first end of each of said plurality of elongate test probes being substantially aligned with a limited-access target on the loaded circuit board when said test fixture is positioned adjacent the loaded circuit board;

a universal interface plate;

a plurality of double-headed spring probes mounted to said universal interface plate, each of said plurality double-headed spring probes having a first spring loaded head located at a first end of each of said plurality of double-headed spring probes and a second spring loaded head located at a second end of each of said plurality of double-headed spring probes, each of said plurality of double-headed spring probes being generally axially aligned with a corresponding one of said plurality of elongate test probes so that the first spring loaded head of each of said plurality of said double-headed spring probes contacts the second end of each corresponding one of said plurality of elongate test probes;

a wireless interface printed circuit board having a first side and a second side;

a plurality of contact pads on the first side of said wireless interface printed circuit board, each of said plurality of contact pads being substantially aligned with a corresponding one of said plurality of double-headed spring probes so that each of said plurality of contact pads contacts the second spring loaded head of each corresponding one of said plurality of double-headed spring probes; and a plurality of contact targets on the second side of said wireless interface printed circuit board, each of said plurality of contact targets being electrically connected to a corresponding one of said plurality of contact pads on the first side of said wireless interface printed circuit board, each of said plurality of contact targets contacting a corresponding one of the plurality of interface probes of the tester when said test fixture is mounted on the tester.

2. The test fixture of claim 1, wherein said universal interface plate positions said plurality of double-headed spring probes in a predetermined universal pattern array.

3. The test fixture of claim 1, wherein said universal interface plate is positioned in generally parallel, spaced-apart relation to said wireless interface printed circuit board.

4. The test fixture of claim 1, further comprising a plurality of guide plates positioned in generally parallel, spaced-apart relation, each of said plurality of guide plates having a plurality of through holes therein sized to slidably receive said plurality of elongate test probes so that said plurality of elongate test probes extend through the through holes in each of said plurality of guide plates and so that the first end of each of said plurality of elongate test probes is substantially aligned with a limited-access test target on the loaded circuit board when said test fixture is positioned adjacent the loaded circuit board.

5. The test fixture of claim 4, wherein said universal interface plate is positioned in generally parallel, spaced-apart relation to said plurality of guide plates.

6. A test fixture for electrically connecting a limited-access test target on a loaded circuit board with an interface probe of a tester, comprising:

test probe means for making electrical contact with the limited-access test target on the loaded circuit board;

double-headed spring probe means generally axially aligned with said test probe means for making electrical contact with said test probe means;

universal interface plate means for holding said double-headed spring probe means in alignment with said test probe means; and wireless interface printed circuit board means positioned adjacent said universal interface plate means for making electrical contact with said double-headed spring probe means and for making electrical contact with the interface probe of the tester when said test fixture is mounted on the tester.

7. The test fixture of claim 6, further comprising guide plate means for holding said test probe means in alignment with the limited-access test target on the loaded circuit board when said test fixture is positioned adjacent the loaded circuit board.

* * * * *